United States Patent

De Bastiani

[11] Patent Number: 6,136,127
[45] Date of Patent: Oct. 24, 2000

[54] ELECTRICALLY CONDUCTIVE ADHESIVE TRANSFERS

[75] Inventor: Norman P. De Bastiani, S. Hadley, Mass.

[73] Assignee: Chartpak, Inc., Leeds, Mass.

[21] Appl. No.: 09/166,494

[22] Filed: Oct. 5, 1998

[51] Int. Cl.[7] .......................... B44C 1/165; B32B 31/00; B41M 3/12; C09J 31/00
[52] U.S. Cl. .................. 156/230; 156/233; 156/239; 156/240; 156/247; 156/289; 427/146; 427/147; 428/914
[58] Field of Search ...................... 156/230, 233, 156/237, 238, 239, 240, 241, 247, 277, 289; 428/914; 427/146, 147, 148; 200/5 A

[56] References Cited

U.S. PATENT DOCUMENTS

| | | | |
|---|---|---|---|
| 4,177,309 | 12/1979 | Shadbolt et al. | 428/195 |
| 4,308,310 | 12/1981 | Arnold et al. | 428/195 |
| 4,421,816 | 12/1983 | Arnold | 428/202 |
| 4,786,767 | 11/1988 | Kihlman | 200/5 A |
| 5,049,434 | 9/1991 | Wasulko | 428/202 |
| 5,061,830 | 10/1991 | Ambrose | 200/5 A |
| 5,239,152 | 8/1993 | Caldwell et al. | 200/600 |
| 5,352,315 | 10/1994 | Carrier et al. | 156/267 |
| 5,751,256 | 5/1998 | McDonough et al. | 343/873 |

*Primary Examiner*—James Sells
*Assistant Examiner*—J. A. Lorengo
*Attorney, Agent, or Firm*—Schweitzer Cornman Gross & Bondell LLP

[57] ABSTRACT

An electrically functional adhesive transfer for use in the manufacture and/or the design of flexible membrane circuits. Electrical circuit elements, instead of being printed directly upon polyester film substrates, are printed upon a carrier sheet. A pressure sensitive adhesive is applied over the exposed surfaces of the printed circuit pattern on the carrier sheet and covered by a release paper. The circuit later is applied to any desired substrate by peeling away the release paper and mounting the circuit by means of the pressure sensitive adhesive. The carrier sheet typically is peeled away after the circuit is adhesively bonded to the substrate. The carrier sheet desirably is transparent or translucent in order to facilitate visual alignment of the circuit pattern with the substrate to which it is being bonded.

4 Claims, 1 Drawing Sheet

ELECTRICALLY CONDUCTIVE ADHESIVE TRANSFERS

BACKGROUND AND SUMMARY OF THE INVENTION

Flexible membrane circuits are in widespread usage in a variety of applications. Among these, by way of example, are input devices actuated by finger pressure, for data entry, control setting, etc. Typically, such devices involve a flexible membrane, provided with externally visible graphics, such as number pads, on/off switches and the like, where an operator applies finger pressure to the outside of the flexible membrane, over a selected graphic element, to perform a desired operation. Such flexible membrane circuits are normally constructed using printed circuit principles, and can be relatively complex in nature.

Typical procedures for the manufacture of flexible membrane circuits involve the preparation of polyester films, which are printed with successive layers of electrically functional inks (conductive and dielectric). Typical conductive inks are pigmented with silver or graphite, although other metals such as gold, nickel and copper have also been employed. The conductive ink is printed directly onto the surface of the polyester film in the form of electrical paths that will make up a circuit or switch. A very simple circuit may comprise a single layer of conductive ink, applied in a predetermined electrical layout, with connectors attached. More complex circuit arrangements can also be made up using multiple layers of conductive ink patterns, with intervening dielectric layers as appropriate. Films thus prepared commonly are referred to as "static layers".

A simple or complex, multi-level static layer frequently is adhesively combined with a second film called a "graphic layer". The graphic layer includes the switch graphics printed on the top side of the film and a conductive circuit appropriately patterned, conductive printed on the back side. With this invention, the graphic layer can be direct printed or can be generated via transfers. The graphic layer and static layer are laminated with appropriate spacers, domes, tails, etc. to make up a complete, functioning flexible membrane circuit or switch.

The present invention is directed to improved components and techniques for the production of flexible membrane and similar circuits in a manner to greatly increase the variety and flexibility of circuit design and production. In particular, the present invention is directed to the provision of an electrically functional adhesive transfer product, in which circuit patterns for flexible membrane circuits are applied in one or more layers to a carrier sheet or film. The circuit elements are coated with a suitable pressure sensitive adhesive, which in turn is protected by a release paper. The circuit thus formed can later be applied to a desired substrate, by peeling away the protective release paper and by transferring and adhering the circuit to the substrate by the now exposed pressure sensitive adhesive. The carrier sheet, which can be peeled away after adhesive mounting of the circuit, advantageously is transparent, or at least translucent, so that the circuit pattern can be viewed through the carrier sheet to facilitate proper alignment with the substrate to which it is mounted.

A number of important advantages are derived from the invention. Among these, the electrically functional circuit can be transferred to a much wider variety of difficult substrates than is possible using conventional techniques. It is also possible to provide electrically functional adhesive transfer products that can be used to repair existing flexible membrane circuits. Additionally, it is contemplated that electrically functional adhesive transfer products may be made in a wide variety of "standard" components, such as connector pattern strips, dual in-line strips, insulator strips, elbows, doughnuts, terminal strips, etc. that can conveniently be used by circuit designers, to prepare and test prototype circuits, for example. This invention alternatively can be used to form electrically conductive adhesive transfers for such applications as electromagnetic interference (EMI), radio frequency interference (RFI) and electrostatic dissipating (ESD) in special shielding.

Other features and advantages of the invention will become apparent upon reference to the following detailed description of preferred embodiments and to the accompanying drawings.

DESCRIPTION OF PREFERRED EMBODIMENTS OF THE INVENTION

Figure 1:
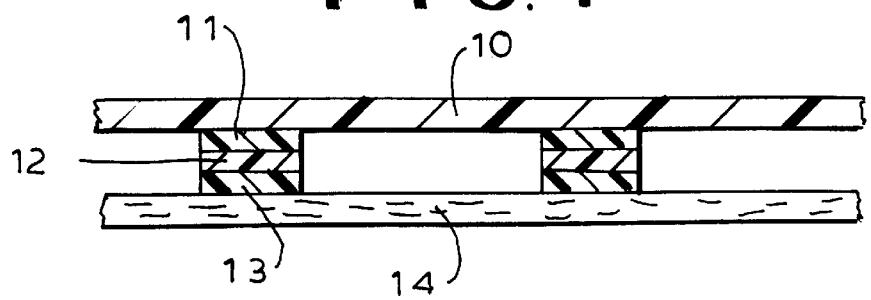
FIG. 1 is a simplified cross sectional representation of an electrically functional adhesive transfer product according to the invention.

Referring now to the drawings, and initially to FIG. 1 thereof, the reference numeral 10 designates a carrier sheet which, in the illustration of FIG. 1, advantageously is a plastic film, comprised of a single polymer or copolymer thermoplastic material. Suitable such materials are styrene, high density polyethylene, vinyl, styrene/butadiene, polycarbonate or the like, extruded in the form of flat films, advantageously to a thickness in the range of 0.002 inch (0.0508 mm) to 0.010 inch (0.259 mm). To particular advantage, the carrier sheet 10 is transparent or translucent. As will be apparent hereinafter, this property is beneficial when one is applying the adhesive transfer product to a receiving substrate, to properly align the circuit pattern thereon. A simple form of circuit pattern illustrated in the product of FIG. 1 comprises a transfer ink 11, a conductive (or dielectric) layer 12 and a layer 13 of pressure sensitive adhesive. The three layers 11–13 are applied by a screen printing process, in itself generally well known.

The transfer ink 11 is formulated from ingredients that exhibit good film forming characteristics, good tensile strength, and good release characteristics after being screen printed onto the surface of the thermoplastic carrier sheet 10 and dried. Generally, the layer of transfer ink 11 is formed to have non-conductive characteristics. However, for certain applications, conductive characteristics may be desired and can be provided.

In general, the formulation of the transfer ink is such that it selectively wets the surface of the carrier film, to adhere to the surface only by a physical static surface attraction, rather than a chemical bond. This enables the dried and formed transfer ink to easily release from the carrier sheet enabling an easy adhesive transfer of the circuit elements to a receiving substrate. Desirably, the force to release the transfer ink from the carrier sheet is in the range of two to four grams per inch when measured as described in the Pressure Sensitive Tape Counsel Test Method No. PSTC No. 1. Thus, the specific composition of the transfer ink must be selected and matched to the physical nature of the carrier sheet itself. The array of solvents, film forming resins and additives must be selected and formulated in such a way that the transfer ink will not bond to the carrier sheet.

The layer of transfer ink 11 is applied to the carrier sheet 10 in a predetermined circuit pattern, being printed directly on the surface of the carrier sheet to provide a dry film thickness in the desirable range 0.0001 inch (0.00254 mm) to 0.0003 inch (0.0076 mm), using a polyester or stainless steel fabric screen with a mesh count of 100–300 threads per inch. Air drying of the screen printed ink can be carried out at room temperature, over a period of 4–8 hours. The printed carrier sheet can also be oven dried in a drying tunnel for 45–75 seconds at a temperature of 130–190° F. (52–88° C.).

The electrically functional layer 12 is applied by screen printing techniques directly over the printed pattern of the transfer ink 11. Both conductive and insulating paths may be desired, depending on the specific application. These paths may be highly conductive or resistive or insulating, depending principally on the circuit design. The conductive layer 12 may be comprised principally of thermoplastic, thermosetting or u.v. curable resin systems formulated into conductive and dielectric screen inks. In general, the thermosetting resins are most desirable for conductive inks, and the u.v. curable resins are most desirable for the dielectric inks. These inks are available from DuPont (Electronic Materials Division) and Acheson Colloids Company.

Conductive inks, commonly called polymer thick film compositions, are generally pigmented with silver, graphite, copper, tin or a combination of the foregoing, together with additives. Where thermoplastic materials are employed, curing is achieved by removal of the solvent by air drying at room temperature or oven drying at modestly elevated temperatures. Where thermoset resins are employed, curing is achieved by removal of the solvent and cross linking of the organic components of the system in a drying oven at elevated temperature. The curing cycle is a function of temperature and time. Representative examples are: 140° F. (60° C.) for two hours; 212° F. (100° C.) for 30–45 minutes; 240° F. (115° C.) for 1–2 minutes. Optimum properties are developed only after the polymer thick film composition has been properly dried and cured. These properties are (a) desired level of conductivity, (b) adhesion, (c) flexibility, (d) desired hardness, (e) temperature resistance, (f) scuff and scratch resistance, and (g) solvent resistance, among others.

The electrically functional ink layer 12 is applied directly over the layer 11 of transfer ink. Accordingly, the electrically functional ink 12 must bond to the transfer ink layer 11 without, however, affecting its film properties. To advantage, the electrically functional ink is applied by screen printing techniques, utilizing a polyester or stainless steel screen having a mesh count in the range of 160–325 threads per inch, using a solvent resistant emulsion applied at a thickness range of 0.0008 inch (0.020 mm) to 0.0015 inch (0.038 mm). The cured (dried) electrically functional ink thickness typically will be in the range of 0.0002 inch (0.0051 mm) to 0.0006 inch (0.015 mm). A solvent resistant polyurethane squeegee with a durameter of 60–80 is used to advantage in this operation.

When the electrically functional ink is a dielectric material, as may be desired to insulate one conductive path from another, where the conductive path cross or otherwise would touch, a slightly different material is preferred. To particular advantage a u.v. curable, 100% solid, dielectric ink is employed. It is composed of a monomer, an oligomer, a photoinitiator, pigment and additives. The photoinitiator absorbs u.v. radiation in the range of 200–400 manometers and starts polymerization of the oligomer and monomer, forming a dielectric polymer film containing the pigments and additives. The uncured dielectric ink is advantageously applied in a screen printing process, utilizing polyester or stainless steel with a mesh range of 200–400 threads per inch. The material is applied to achieve a cured thickness of 0.001 inch (0.00254 mm) to 0.012 inch (0.030 mm). The cured dielectric layer advantageously exhibits an insulating resistance or dielectric strength.

The pressure sensitive adhesive layer 13 can be one of a variety of such pressure sensitive adhesives well known in the trade for adhesive transfer products. The adhesive is applied over the electrically functional pattern 12, in the same pattern as that of the electrically functional layer 12, by known screen printing techniques. A silicone release paper 14 is applied over the pressure sensitive adhesive 13 to protect it until the product is ready for use.

The transfer product of FIG. 1 is utilized by removing the release paper 14 and applying the pressure sensitive adhesive layer 13 to a desired substrate 44. The substrate 44 may be a polyester film, for example, but can also be a rather wide variety of other materials, including paper-like materials, fabrics, glass, ceramics, metal, plastics, and the like. Prior to contact of the pressure sensitive adhesive 13 with the substrate 44, the circuit pattern of the transfer product is properly aligned with the substrate. To best advantage, this is facilitated by providing for the carrier sheet 10 to be transparent or translucent, so that a user may make the desired alignment visually through the carrier sheet. It would also be possible, in appropriate cases, to utilize an opaque carrier provided with sufficient externally visible indicia (not shown) to enable it to be properly aligned with the substrate.

Figures 4, 5:
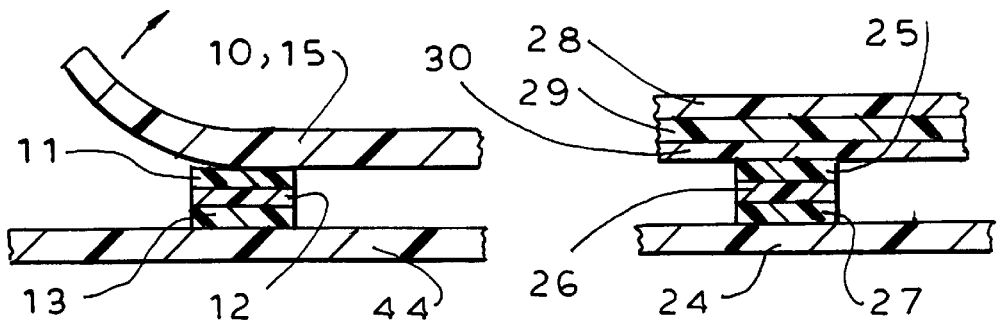
FIG. 4 is a cross sectional representation, similar to FIG. 1, showing the circuit of FIG. 1 applied to a receiving substrate.
FIG. 5 is a cross sectional representation, similar to FIG. 4, illustrating a product in which multiple adhesive transfer products have been applied to a receiving substrate.

When the transfer product has been transferred and adhered to the substrate 44, the carrier sheet 10 may be peeled away, as indicated in FIG. 4, exposing the layer 11 of transfer ink. The circuit thus produced may be laminated with another film called the "graphic layer" (not shown) applied over the substrate 44, transfer layer 11, conductive layer 12, and the adhesive layer 13, encapsulating and, bonding thereto, in accordance with known principles.

Figures 2, 3:
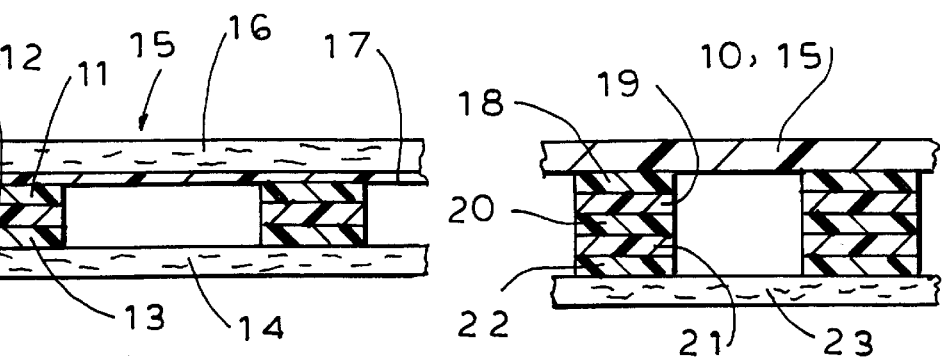
FIG. 2 is a view, similar to FIG. 1, showing a modified form of the adhesive transfer product.
FIG. 3 is a cross sectional representation, similar to FIG. 1, illustrating a form of a more complex adhesive transfer product in which circuits are applied in multiple layers.

A particularly desirable alternative form of the new transfer product is illustrated in FIG. 2. In the embodiment of FIG. 2, the carrier sheet 15 is comprised of a thermally and chemically stable carrier substrate 16. The carrier substrate 16 may be of a stable plastic material such as polypropylene, Teflon, polyethylene terathylate, polyethylene naphthalate, polyamide, epoxy glass, or the like extruded into a flat film of a thickness range in the order of 0.00145 inch (0.00368 mm) to 0.010 inch (0.0254 mm). The substrate 16 may also be formed of a paper material, such as vegetable parchment, densified Kraft and the like. A paper substrate advantageously will have a basis weight in the range of 20–40 pounds (9–18 kg) per ream of 500 sheets (24"×36"; 609.6 mm×914.4 mm).

Whether the carrier substrate 16 is formed of film or paper, it is provided with a polymeric coating 17 on the surface to which the functional circuit elements are to be applied. The polymeric coating is applied in a relatively thin layer, preferably in the thickness range of 0.00005 inch (0.00127 mm) to 0.0002 inch (0.005 mm). It is formed of a substantially non-extensible material which is insoluble in the solvents typically used in the conductive printing media and in the adhesive formulas. These properties are found in many cross linked thermosetting polymers such as polyvinyl butral-melamine, polyvinyl formal-phenol, ureaformaldehyde, epoxy-melamine, acrylics, acrylic-melamine, etc. A modified cross linked silicone polymeric coating can also be used. The polymeric coating must have very low ultimate elongation, desirably in the range of 0.5 to 1.0% as described by the ASTM Test Method No. ASTM D638.

For the carrier substrate 16 and polymeric coating 17 to be useful in a transfer product according to the invention, there should be no detectable interaction between the solvents, the polymeric coating and the carrier material. For example, a variety of chemical solvents diluents, and chemical compounds normally found in screenings have been applied to the surface of the polymeric coating and allowed to evaporate, with no detectable physical or chemical effect observed on the surface. These solvents, diluents and other chemical compounds include mineral spirits, butyl cellosolve, n-butylacetate, 1-nitropropane, heptane, hexane, acetone, methyl ethyl ketone, cyclohexane, toluene, xylene, ethyl acetate, carbitol acetate, isophorone, methyl iso-butyl ketone, 1,4 dixone, ethanol, isopropanol, N-butyl alcohol, tetrahydrofuran, methylene chloride, tri chloro ethylene, butanol, cyclohexanone, diacetone alcohol, dibutyl phthalate, aromatic 100, tricresyl phosphate, varsol 1, propylene glycol methyl ether, di propylene glycol methyl ether, ethylene glycol butyl ether, ethyl glycol ethyl ether, dipropylene glycol, methyl ether acetate, diethylene glycol, methyl ether, VM+P naptha, butyl benzyl phthalate, and octyl diphenyl phosphate to name a few.

The composite carrier film 15 of the FIG. 2 embodiment is preferred for many uses because of its greater resistance to high temperature and its greater chemical stability.

In the embodiment of FIG. 3, multiple functional circuit elements are provided in a single adhesive transfer product. In the FIG. 3 modification, a carrier sheet 10 or 15 is provided with successive layers comprising, in order from top to bottom, a layer of transfer ink 18, a layer of conductive ink 19, a dielectric layer 20, a second layer of conductive ink 21, and a final layer 22 of pressure sensitive adhesive. A release paper 23 is applied over the pressure sensitive adhesive, pending application of the product to a selected substrate.

While the multiple layers shown in FIG. 3 are illustrated as being coincident, it will be understood that successive layers may be arranged in different circuit patterns where desirable and appropriate.

Likewise, it is possible, in the construction of a circuit using the adhesive transfer products of the invention, to apply one transfer product over another, in order to construct multilayer circuits. In the arrangement of FIG. 5, for example, a substrate 24 has applied thereto a first transfer product comprising a transfer ink 25, a layer 26 of electrically functional material, and a layer 27 of pressure sensitive adhesive. A second transfer product is then applied over the first. In the illustration of FIG. 5, the second transfer product comprises a layer 28 of transfer ink, a layer 29 of electrically functional material, and a layer 30 of pressure sensitive adhesive. In the illustration of FIG. 5, the second layer is applied in a non-coincident configuration with respect to the first. In some cases, where electrical connections are intended to be provided at crossing points between vertically adjacent conductive elements, the transfer ink layer 25 and the pressure sensitive ink layer 30 may be formulated to have sufficient conductivity to provide a reasonable conductive path in the vertical direction.

The products and procedures of the present invention provide for a novel and highly advantageous manner of producing flexible membrane circuits. By providing for the adhesive transfer of circuits from a carrier sheet to a desired substrate, it becomes possible to utilize a wide range of substrates heretofore unsuited for such circuitry. In this respect, the circuits can be transferred to many substrate materials on which it would be impossible to construct a flexible membrane circuit in the first instance using conventional techniques. For example, it is contemplated that, using products and teachings and procedures of the present invention, flexible membrane circuits may be constructed on fabrics, and perhaps incorporated into articles of clothing, and on three dimensional objects like glass, ceramic, lamps, wall, pictures, etc. The invention also can be utilized to advantage in the design and installation of conductive circuits for EMI, RFI and ESD shielding, for example. The products of the invention can also be used in connection with the repair of existing circuits in certain instances. Additionally, the use of adhesive transfer circuit elements makes it more efficient and more expeditious to produce experimental prototype circuitry for testing and other purposes, using inexpensive adhesive transfer products.

It should be understood, of course, that the specific forms of the invention herein illustrated and described are intended to be representative only, as certain changes may be made therein without departing from the clear teachings of the disclosure. Accordingly, reference should be made to the following appended claims in determining the full scope of the invention.

I claim:

1. The method of constructing a flexible membrane circuit which comprises
   (a) preparing an electrically functional adhesive transfer product which comprises,
      (i) a carrier sheet having a transfer surface which is composed of, or coated with, a transfer material,
      (ii) a transfer ink physically and releasably applied to said transfer surface in a printed pattern corresponding generally to a predetermined desired circuit,
      (iii) one or more layers of electrically functional ink applied over said transfer ink in a predetermined, electrically functional pattern corresponding to said predetermined desired circuit,
      (iv) a pressure sensitive adhesive applied over exposed surfaces of said layers of ink in a pattern corresponding generally to the pattern thereof, and
      (v) a release sheet applied over said pressure sensitive adhesive and releasably bonding therewith,
   (b) selecting a suitable receiving substrate to receive said transfer product,
   (c) removing the release sheet from said transfer product, and
   (d) adhesively mounting said product on said receiving substrate.

2. A method according to claim 1, wherein
   (a) the carrier sheet is removed from said product after adhesive mounting of said product on said receiving substrate.

3. A method according to claim 1, wherein
   (a) said carrier sheet is of transparent or translucent material, and
   (b) said adhesive transfer product is aligned with said receiving substrate by sighting through said carrier sheet.

4. A method according to claim 1, wherein
   (a) a second adhesive transfer product is adhesively mounted on said first mentioned transfer product to provide a circuit of multiple layers.

* * * * *